United States Patent
Tokuda et al.

(10) Patent No.: US 11,600,895 B2
(45) Date of Patent: Mar. 7, 2023

(54) DIRECTIONAL COUPLER

(71) Applicant: Murata Manufacturing Co., Ltd., Kyoto (JP)

(72) Inventors: Daisuke Tokuda, Kyoto (JP); Yasushi Shigeno, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/984,701

(22) Filed: Aug. 4, 2020

(65) Prior Publication Data

US 2020/0365964 A1 Nov. 19, 2020

Related U.S. Application Data

(63) Continuation of application No. PCT/JP2019/003496, filed on Jan. 31, 2019.

(30) Foreign Application Priority Data

Feb. 5, 2018 (JP) .............................. JP2018-018277

(51) Int. Cl.
*H01P 5/18* (2006.01)
*H01P 1/15* (2006.01)
*H01P 1/24* (2006.01)

(52) U.S. Cl.
CPC ................ *H01P 5/184* (2013.01); *H01P 1/15* (2013.01); *H01P 1/24* (2013.01)

(58) Field of Classification Search
CPC .... H01P 5/18; H01P 5/184; H01P 1/10; H01P 1/15
See application file for complete search history.

(56) References Cited

U.S. PATENT DOCUMENTS 5,363,071 A 11/1994 Schwent et al.
8,289,102 B2 * 10/2012 Yamamoto .............. H01P 5/184
333/116

(Continued)

FOREIGN PATENT DOCUMENTS

JP H07508872 A 9/1995
JP 2008011188 A 1/2008

(Continued)

OTHER PUBLICATIONS

International Search Report issued in Application No. PCT/JP2019/003496, dated Mar. 26, 2019.

(Continued)

*Primary Examiner* — Hafizur Rahman
*Assistant Examiner* — Kimberly E Glenn
(74) *Attorney, Agent, or Firm* — Pearne & Gordon LLP

(57) ABSTRACT

A directional coupler (1) includes a substrate (10), a main line (20) formed directly or indirectly on the substrate (10), sub-lines (21, 22 and 23) at least part of each of which is formed directly or indirectly on the substrate (10) along the main line (20), a switch (30) switching connections among end portions of the plurality of sub-lines (21, 22 and 23), and detection output terminals (FWD and REV) connected to the sub-line (21), wherein, when looking at the substrate (10) in plan, the end portions of the sub-lines (21, 22 and 23) are disposed on the opposite side to the detection output terminals (FWD and REV) relative to the main line (20), and the sub-line (21) to which the detection output terminals (FWD and REV) are connected is overlapped with or surrounded by the sub-lines (22 and 23).

20 Claims, 8 Drawing Sheets

(56) References Cited

U.S. PATENT DOCUMENTS

| | | | |
|---|---|---|---|
| 9,184,485 B2* | 11/2015 | Yoshioka | ................ H01P 5/187 |
| 9,503,044 B2 | 11/2016 | Granger-Jones et al. | |
| 2017/0317396 A1 | 11/2017 | Srirattana et al. | |
| 2018/0123215 A1* | 5/2018 | Goto | ........................ H01P 5/187 |
| 2018/0351229 A1* | 12/2018 | Kim | ........................ H01P 5/185 |

FOREIGN PATENT DOCUMENTS

| | | | |
|---|---|---|---|
| JP | 2008244924 A | 10/2008 | |
| KR | 20030091522 A | 12/2003 | |
| WO | 2013042756 A1 | 3/2013 | |

OTHER PUBLICATIONS

Written Opinion issued in Application No. PCT/JP2019/003496, dated Mar. 26, 2019.

\* cited by examiner

DIRECTIONAL COUPLER

This is a continuation of International Application No. PCT/JP2019/003496 filed on Jan. 31, 2019 which claims priority from Japanese Patent Application No. 2018-018277 filed on Feb. 5, 2018. The contents of these applications are incorporated herein by reference in their entireties.

BACKGROUND OF THE DISCLOSURE

Field of the Disclosure

The present disclosure relates to a directional coupler.

Description of the Related Art

A directional coupler including a main line and a plurality of sub-lines is known so far (for example, Patent Document 1). In the directional coupler disclosed in Patent Document 1, a degree of coupling between the main line and each sub-line can be adjusted by switching connections among the sub-lines with a switch to form different sub-lines of various lengths.
Patent Document 1: U.S. Pat. No. 9,503,044 specification

BRIEF SUMMARY OF THE DISCLOSURE

In the above-described directional coupler, however, there is a possibility that stable detection accuracy cannot be obtained because directivity in detection of a forward signal and directivity in detection of a reverse signal are different from each other.

Accordingly, an object of the present disclosure is to provide a directional coupler that can reduce a difference in the directivity depending on the direction of a signal to be detected, and that can ensure stable detection accuracy.

To achieve the above-mentioned object, a directional coupler according to an embodiment of the present disclosure includes a substrate, a main line formed directly or indirectly on the substrate, a plurality of sub-lines at least part of each of which is formed directly or indirectly on the substrate along the main line, a switch switching connections among end portions of the plurality of sub-lines, and detection output terminals connected to one of the plurality of sub-lines, wherein, when looking at the substrate in plan, the end portions of the plurality of sub-lines are disposed on the opposite side to the detection output terminals relative to the main line, and the sub-line to which the detection output terminals are connected is overlapped with or surrounded by the other one or more sub-lines.

With the directional coupler according to the present disclosure, since it is easier to form each of the sub-lines symmetrically with respect to the main line, directivity in signal detection becomes more uniform and detection accuracy is stabilized.

DETAILED DESCRIPTION OF THE DISCLOSURE

Figure 1:
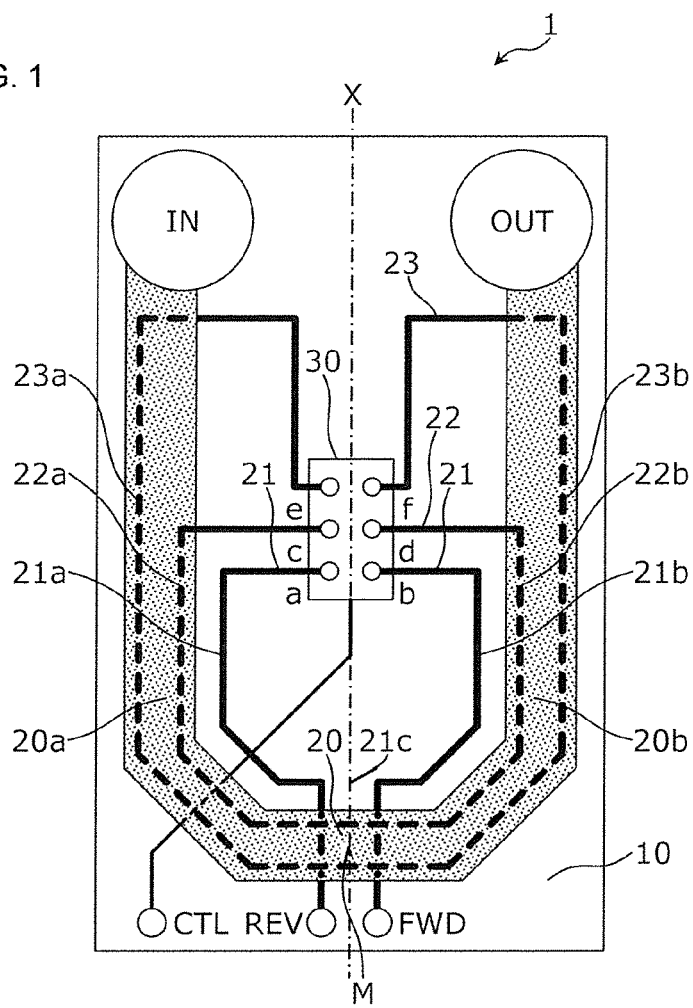
FIG. 1 is a plan view illustrating an example of a planar structure of a directional coupler according to Embodiment 1.

Several embodiments of the present disclosure will be described in detail below with reference to the drawings. It is to be noted that any of the following embodiments represents a generic or specific example. Numerical values, shapes, materials, constituent members, arrangements and connection forms of the constituent members, and so on, which are described in the following embodiments, are merely illustrative, and they are not purported to limit the present disclosure.

Embodiment 1

Embodiment 1 is described in connection with, as an example of directional couplers, a 4-port directional coupler that includes an input port IN, an output port OUT, and detected signal output terminals FWD and REV, and that can switch degrees of coupling between a main line and sub-lines with a switch.

In the following description, a signal propagating from the input port IN to the output port OUT is called a forward signal, and a signal propagating from the output port OUT to the input port IN is called a reverse signal. A first detected signal corresponding to the forward signal is outputted from the detected signal output terminal FWD, and a second detected signal corresponding to the reverse signal is outputted from the detected signal output terminal REV.

The related-art directional coupler disclosed in FIG. 5 of Patent Document 1, for example, is an example of 4-port directional couplers that can switch degrees of coupling between a main line and sub-lines with a switch.

In the related-art directional coupler, the main line is formed in a U-like shape, and one end and the other end of the main line are connected to an RF input port $RF_{in}$ and an RF output port $RF_{out}$, respectively. A first sub-line to which an isolation port $ISO_{fwd}$ is connected, a second sub-line, and a third sub-line to which an isolation port $ISO_{rev}$ is connected are disposed along the main line. The first sub-line is positioned on the inner side of the second sub-line, and the third sub-line is positioned on the outer side of the second sub-line. The RF input port $RF_{in}$, the RF output port $RF_{out}$, and the isolation ports $ISO_{fwd}$ and $ISO_{rev}$ in the related-art directional coupler correspond respectively to the input port IN, the output port OUT, and the detected signal output terminals FWD and REV in the present disclosure.

In the related-art directional coupler, because of having the above-described arrangement, both end portions of a sub-line formed by connecting the individual sub-lines, namely a portion on the same side as the isolation port $ISO_{fwd}$ and a portion on the same side as the isolation port $ISO_{rev}$, are not at equivalent positions with respect to the main line.

Therefore, a difference in degree of coupling with the main line occurs between both the end portions of the sub-line, thus causing a difference between the intensity of a detected signal outputted from the isolation port $ISO_{fwd}$ and the intensity of a detected signal outputted from the isolation port $ISO_{rev}$. As a result, the related-art directional coupler accompanies with a possibility that directivity in detection of the forward signal and directivity in detection of the reverse signal are different from each other, and hence that stable detection accuracy cannot be obtained.

In consideration of the above-described point, the inventors propose a directional coupler that can reduce the above-mentioned difference in the directivity and can ensure stable detection accuracy.

First, an example of a planar structure of a directional coupler according to Embodiment 1 is described.

FIG. 1 is a plan view illustrating an example of the planar structure of the directional coupler 1 according to Embodiment 1. As illustrated in FIG. 1, the directional coupler 1 includes a substrate 10, a main line 20, sub-lines 21, 22 and 23, and a switch 30.

The main line 20 is constituted by a metal film formed directly or indirectly on the substrate 10, and a first end and a second end of the main line 20 are connected to the input port IN and the output port OUT, respectively. In the following description, a portion of the main line 20 between a midpoint M and the first end is called a first portion 20a, and a portion of the main line 20 between the midpoint M and the second end is called a second portion 20b. Here, the midpoint M of the main line 20 represents a point that is set in a central portion of the main line 20, namely in a portion of the main line 20 except for both the end portions, and it is not always limited to a point dividing the length of the main line 20 in half.

The sub-lines 21, 22 and 23 are constituted by metal films formed directly or indirectly on the substrate 10, and at least part of each sub-line is formed along the main line 20. In FIG. 1, portions of the sub-lines 21, 22 and 23 hidden by the main line 20, namely portions of the sub-lines 21, 22 and 23 positioned between the main line 20 and the substrate 10 when viewed in a lamination direction, are denoted by the dashed lines. A laminated structure of the directional coupler 1 will be described in detail below.

The sub-line 21 includes a first coupling portion 21a extending along the first portion 20a of the main line 20 and a second coupling portion 21b extending along the second portion 20b of the main line 20. Here, the wording "a first line extends along a second line" may imply the case in which the first line is arranged with a substantially constant distance held relative to the second line, or the case in which the first line and the second line are arranged substantially parallel to each other.

Similarly, the sub-line 22 includes a first coupling portion 22a extending along the first portion 20a of the main line 20 and a second coupling portion 22b extending along the second portion 20b of the main line 20. The sub-line 23 includes a first coupling portion 23a extending along the first portion 20a of the main line 20 and a second coupling portion 23b extending along the second portion 20b of the main line 20.

End portions of each of the sub-lines 21, 22 and 23 are positioned, with respect to a central portion and end portions of the main line 20, on the end portion side (namely, on the side closer to the first end and the second end of the main line), and they are connected to the switch 30. The sub-line 21 has a gap 21c in its central portion. One end and the other end of the sub-line 21 sandwiching the gap 21c are connected respectively to the detected signal output terminals REV and FWD by lead-out lines. In other words, one of both the end portions of the first coupling portion 21a, the one end portion being not connected to the switch 30, is connected to the detected signal output terminal REV, and one of both the end portions of the second coupling portion 21b, the one end portion being not connected to the switch 30, is connected to the detected signal output terminal FWD.

The end portions of each of the sub-lines 21, 22 and 23 are positioned on the inner side of the main line 20 when the end portions of the main line 20 are interconnected so as to define an imaginary ring-like shape, and the detected signal output terminals REV and FWD are positioned on the outer side of the main line 20 when the end portions of the main line 20 are interconnected so as to define the imaginary ring-like shape. Thus, the end portions of each of the sub-lines 21, 22 and 23 are arranged on the opposite side to the detected signal output terminals REV and FWD relative to the main line 20.

When looking at the substrate 10 in plan, the detected signal output terminals REV and FWD and the input and output ports IN and OUT are formed in opposite side regions of the substrate 10. In an example of FIG. 1, the input port IN and the output port OUT are disposed in a region along an upper side of the substrate 10, and the detected signal output terminals REV and FWD are disposed in a region along a lower side of the substrate 10.

The switch 30 has terminals a to f and switches the connections among the end portions of the sub-lines 21, 22 and 23, those end portions being connected to the terminals a to f. The switch 30 has a plurality of connection states and continuously connects one or more of the sub-lines 21, 22 and 23 in different patterns depending on the connection states of the sub-lines 21, 22 and 23 to form a single sub-line having both ends connected to the detected signal output terminals FWD and REV. Specific examples of the connection states of the directional coupler 1, formed by the switch 30, will be described in detail later.

The switch 30 may switch the connection states in accordance with, for example, a control signal supplied to a control terminal CTL. When the directional coupler 1 detects one from among a plurality of signals in different frequency bands, the control signal may be supplied, for example, from a not-illustrated control circuit depending on the frequency band of the signal to be detected.

An example of the laminated structure of the directional coupler 1 will be described below.

Figure 2:
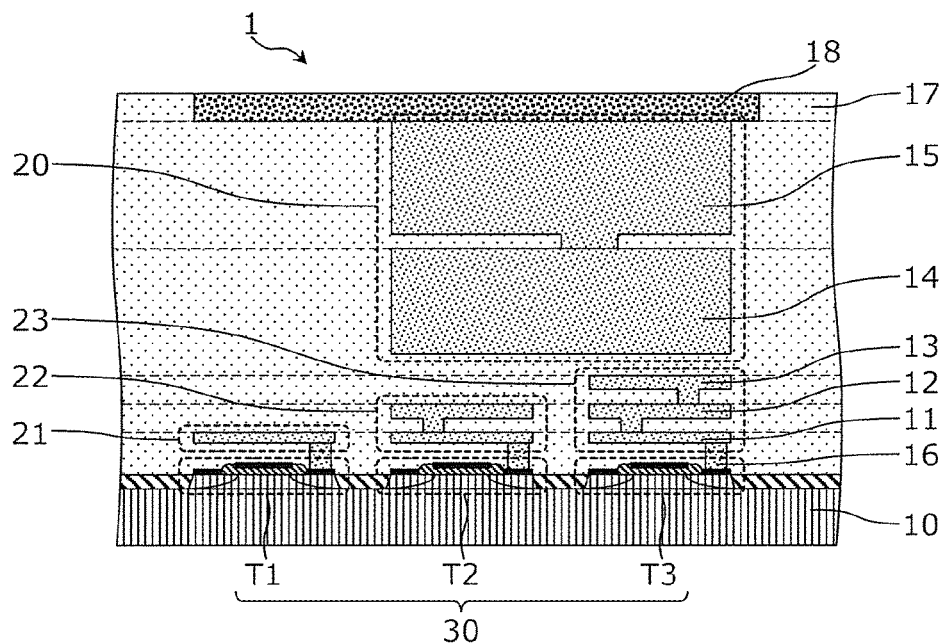
FIG. 2 is a sectional view illustrating an example of a laminated structure of the directional coupler according to Embodiment 1.

FIG. 2 is a sectional view illustrating an example of the laminated structure of the directional coupler 1. In the example of FIG. 2, the directional coupler 1 is constituted by laminating, on the substrate 10, a first metal film 11, a second metal film 12, a third metal film 13, a fourth metal film 14, a fifth metal film 15, interlayer conductors 16, an insulating film 17, and a connection electrode 18.

The substrate 10 may be, though not limited to particular one, a silicon semiconductor substrate, for example. Transistors T1, T2 and T3 constituting the switch 30 are formed on the substrate 10.

The first metal film 11, the second metal film 12, the third metal film 13, the fourth metal film 14, the fifth metal film 15, and the interlayer conductors 16 may be each made of, though not limited to a particular material, copper or a copper alloy. A thickness of the first metal film 11 may be 350 nm, for example. A thickness of each of the second metal film 12 and the third metal film 13 may be 420 nm, for example. A thickness of each of the fourth metal film 14 and the fifth metal film 15 may be 3.4 µm, for example.

The connection electrode 18 may be made of, though not limited to a particular material, a copper alloy containing aluminum, for example. A thickness of the connection electrode 18 may be 1.2 µm, for example.

The insulating film 17 is an insulator filling a region spanning from an upper surface of the substrate 10 up to a lateral surface of the connection electrode 18, and it may be made of, though not limited to a particular material, silicon oxide or silicon nitride, for example. The insulating film 17 is formed by a plurality of laminated layers. In FIG. 2, an interface between adjacent two of the laminated layers is denoted by the dotted line. When two or more among the laminated layers are made of the same material, one or more of the interfaces between those two or more layers may not appear in a visually recognizable manner.

The insulating film 17 may be constituted by a plurality of layers laminated directly on the substrate 10, or a plurality of layers laminated indirectly on the substrate 10. In other words, a BOX (Buried Oxide) layer or the like may be formed between the insulating film 17 and the substrate 10.

The main line 20 is constituted by the fourth metal film 14 and the fifth metal film 15. The sub-line 21 is constituted by the first metal film 11. The sub-line 22 is constituted by the second metal film 12, and it may further include the first metal film 11 that is connected by the interlayer conductor 16. The sub-line 23 is constituted by the third metal film 13, and it may further include the first metal film 11 and the second metal film 12 that are connected by the interlayer conductors 16. The input port IN, the output port OUT, and the detected signal output terminals FWD and REV, and the control terminal CTL are each constituted by the connection electrode 18.

Layers in which the metal films constituting the sub-lines 21 to 23 are to be disposed are not limited to the layers illustrated in FIG. 2. For example, the sub-lines 21 to 23 may be constituted by metal films disposed on the same layer.

Thus, the directional coupler 1 can be constituted as a semiconductor device.

Other one or more constituent elements known in general semiconductor devices may be added to the above-described structure. For example, a buried oxide film and/or an element isolation groove may be formed in the substrate 10. Furthermore, a surface of the connection electrode 18 may be plated with one or more metals selected from among titanium, tungsten, copper, and nickel or any of alloys of those metals. In addition, a portion of a surface of the insulating film 17 except for the connection electrode 18 may be coated with an insulating protective film made of polyimide, for example.

While FIG. 2 illustrates the case in which the metal films 11 to 13 constituting the sub-lines 21 to 23 are disposed between the metal films 14 and 15 both constituting the main line 20 and the substrate 10, the positional relation between the main line 20 and the sub-lines 21 to 23 is not limited to that case. The metal films 14 and 15 both constituting the main line 20 may be disposed between the metal films 11 to 13 constituting the sub-lines 21 to 23 and the substrate 10. As an alternative, the metal film constituting part of the sub-lines 21 to 23 may be disposed between the metal films 14 and 15 both constituting the main line 20 and the connection electrode 18.

Advantageous effects of the directional coupler 1, obtained with the above-described configuration, will be described below.

In the directional coupler 1, when looking at the substrate 10 in plan, the main line 20 is disposed in a ring-like shape part of which is missing (namely, in a nonlinear shape), and at least part of each of the sub-lines 21, 22 and 23 is disposed along the main line 20. The sub-line 21 connected to the detected signal output terminals FWD and REV is surrounded by the sub-lines 22 and 23.

Here, the wording "the sub-line 21 is surrounded by the sub-line 22" may imply that, when looking at the substrate 10 in plan, the whole of the sub-line 21, namely a region spanning from the end portion of the sub-line 21, which is connected to the switch 30, up to the end portion of the sub-line 21, which is not connected to the switch 30, (i.e., a region spanning from one to the other of the end portions sandwiching the gap 21c), is present on the inner side of the sub-line 22 when the end portions of the sub-line 22 are interconnected so as to define an imaginary ring-like shape. Part or the whole of the sub-line 21 may be overlapped with the sub-line 22 insofar as not deviating to the outer side of the sub-line 22.

Similarly, the wording "the sub-line 21 is surrounded by the sub-line 23" may imply that, when looking at the substrate 10 in plan, the whole of the sub-line 21 is present on the inner side of the sub-line 23 when the end portions of the sub-line 23 are interconnected so as to define an imaginary ring-like shape.

With the above-described configuration, since it is easier to form each of the sub-lines 21, 22 and 23 symmetrically with respect to the main line 20, a difference in the directivity depending on the direction of the signal to be detected is reduced. As a result, the directional coupler with stable detection accuracy can be obtained. The wording "the sub-line is symmetrical with respect to the main line 20" may be defined to imply that a position of the first coupling portion of the sub-line relative to the first portion 20a of the main line 20 and a position of the second coupling portion of the sub-line relative to the second portion 20b of the main line 20 are equivalent to each other. This definition is applied to all of the sub-lines including the sub-lines 21, 22 and 23.

The advantageous effect obtained with the above-described arrangement is described in comparison with a comparative example.

Figure 3:
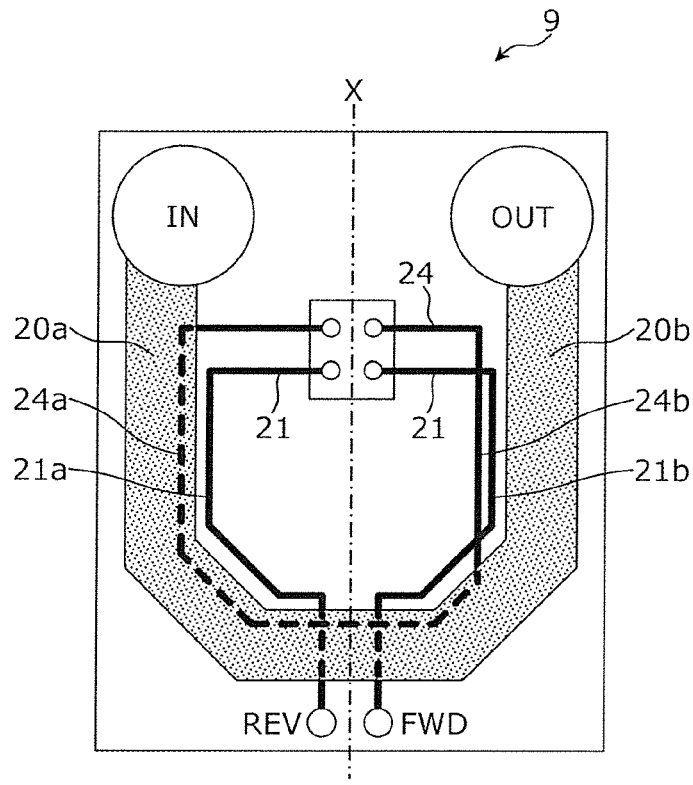
FIG. 3 is a plan view illustrating an example of a planar structure of a directional coupler according to a comparative example.

FIG. 3 is a plan view illustrating an example of a planar structure of a directional coupler 9 according to the comparative example. In FIG. 3, for convenience of explanation, only two sub-lines 21 and 24 in the directional coupler 9 are illustrated, and portions of the sub-lines 21 and 24 hidden by the main line 20 are denoted by the dotted lines.

As illustrated in FIG. 3, in the directional coupler 9, the sub-line 21 connected to the detected signal output terminals FWD and REV is not surrounded by the sub-line 24. In other words, the sub-line 21 partly deviates to the outer side of the sub-line 24 in such a fashion that the sub-lines 21 and 24 have portions swapping the inner and outer positions. With the presence of those portions, it is difficult to dispose both the sub-lines 21 and 24 symmetrically with respect to the main line 20.

In the example of FIG. 3, because the sub-line 21 is disposed symmetrically with respect to the main line 20, the sub-line 24 becomes asymmetrical with respect to the main line 20, which makes a difference in degree of coupling with the main line 20 between a first coupling portion 24a and a second coupling portion 24b of the sub-line 24. Accordingly, when the sub-lines 21 and 24 are connected and used as a single sub-line, there significantly appears a difference in the directivity depending on the direction of the signal to be detected. When the sub-line 24 is disposed symmetrically with respect to the main line 20, a similar problem is supposed to arise because the sub-line 21 becomes asymmetrical with respect to the main line 20.

On the other hand, in the directional coupler 1 in which the sub-line 21 is surrounded by the sub-lines 22 and 23, the sub-lines have no portions swapping the inner and outer positions. This makes it easier to form each of the sub-lines symmetrically with respect to the main line, and the difference in the directivity depending on the direction of the signal to be detected is reduced. As a result, the directional coupler with stable detection accuracy can be obtained.

Referring to FIGS. 1 and 2 again, the description of the features of the structure of the directional coupler 1 is further continued.

The directional coupler 1 may include the insulating film 17 formed by a plurality of layers laminated on the substrate 10, and at least two (all three in the example of FIG. 2) of the sub-lines 21, 22 and 23 may be formed in different ones of the plurality of layers forming the insulating film 17.

With the above-described feature, the degree of coupling between each of the sub-lines 21, 22 and 23 and the main line can be more flexibly adjusted over a wider range than in the case in which the sub-lines 21, 22 and 23 are formed in the same plane, namely in the same layer.

In general, a degree of capacitive coupling between the main line and the sub-line is larger for a signal of a high frequency band in comparison with a signal of a low frequency band. Furthermore, the sub-line positioned in a lower layer farther away from the main line 20 exhibits a smaller degree of coupling with the main line 20. In consideration of the above point, for example, the sub-line 23 formed in an upper layer closer to the main line 20 may be used for detecting the signal of the low frequency band, and the sub-lines 21 and 22 formed in lower layers farther away from the main line 20 may be each used for detecting the signal of the high frequency band.

With the above-described feature, since the degrees of coupling between the main line and the sub-lines are made more uniform between the case of handling the signal of the high frequency band and the case of handling the signal of the low frequency band, it is easier to make the directivity more uniform.

At least two (all three in the example of FIG. 2) of the sub-lines 21, 22 and 23 may have different lengths, and longer one of the two sub-lines of different lengths may be formed in one of the plurality of layers forming the insulating film 17, the one layer being located at an upper position than a layer where shorter one of the two sub-lines of different lengths is formed. In the example of FIGS. 1 and 2, the sub-line 23 is formed in an upper layer than the shorter sub-lines 21 and 22, and the sub-line 22 is formed in an upper layer than the shorter sub-line 21.

With the above-described feature, the degree of coupling between each of the sub-lines 21, 22 and 23 and the main line can be more flexibly adjusted over a wider range than in the case in which the sub-lines 21, 22 and 23 have the same length.

In general, a degree of inductive coupling with the main line 20 is larger in the longer sub-line 23 than in the shorter sub-lines 21 and 22. However, if the degree of coupling is increased in a way biased to the inductive coupling, this may adversely affect the directivity. In consideration of the above point, it is possible to evenly increase both the degrees of capacitive and inductive coupling by disposing the longer sub-line 23 in the layer that is located at an upper position than the layers of the shorter sub-lines 21 and 22 and closer to the main line 20.

For example, the sub-line 23 being longer and formed in the upper layer closer to the main line 20 may be used for detecting the signal of the low frequency band, and the sub-lines 21 and 22 being shorter and formed in the lower layers farther away from the main line 20 may be each used for detecting the signal of the high frequency band.

With the above-described feature, both the degrees of capacitive and inductive coupling between the main line and the sub-lines are made more uniform between the case of handling the signal of the high frequency band and the case of handling the signal of the low frequency band, whereby it is easier to make the directivity more uniform.

When looking at the substrate 10 in plan, all of the sub-lines 21, 22 and 23 may not need to be overlapped with the input port IN and the output port OUT. Here, the input port IN and the output port OUT are an example of a pair of input/output terminals connected to the main line 20.

With the above-described feature, since the sub-lines 21, 22 and 23 are disposed without interfering with the input port IN and the output port OUT at which an electromagnetic field tends to concentrate, it is easier to make the directivity more uniform.

A film thickness of each of wirings (namely the first metal film 11, the second metal film 12, and the third metal film 13 in FIG. 2) forming the sub-lines 21, 22 and 23 may be smaller than that of each of wirings (namely the fourth metal film 14 and the fifth metal film 15 in FIG. 2) forming the main line 20.

With the above-described feature, since the sub-lines 21, 22 and 23 tending to become longer than the main line 20 are formed by the wirings with smaller film thicknesses, the size of the directional coupler 1 can be reduced.

A width of the wiring forming the main line 20 may be greater than that of the wiring forming any of the plurality of sub-lines. The width of the wiring forming the main line 20 may be not less than 5 times the width of the wiring that is widest among the wirings forming the sub-lines.

With the above-described feature, since the main line 20 which allows a larger current to pass through than the sub-lines 21, 22 and 23 is formed by the wiring of the greater width, the insertion loss of the directional coupler 1 can be reduced.

A length of the first coupling portion 21a of the sub-line 21 and a length of the second coupling portion 21b thereof may be substantially the same, a length of the first coupling portion 22a of the sub-line 22 and a length of the second coupling portion 22b thereof may be substantially the same, and a length of the first coupling portion 23a of the sub-line 23 and a length of the second coupling portion 23b thereof may be substantially the same.

With the above-described feature, since the degree of coupling of each of the sub-lines 21, 22 and 23 with the main line 20 is made more uniform between the first coupling portion and the second coupling portion, the difference in the directivity depending on the direction of the signal to be detected can be reduced more effectively. As a result, the directional coupler 1 with more stable detection accuracy can be obtained.

When looking at the substrate 10 in plan, the main line 20 may be disposed in a line-symmetrical shape on both the sides of a symmetry axis X, and the first coupling portion and the second coupling portion of each of the sub-lines 21, 22 and 23 may be disposed in a line-symmetrical shape on both the sides of the symmetry axis X.

With the above-described feature, since the first coupling portion and the second coupling portion of each of the sub-lines 21, 22 and 23 are formed in a geometrically symmetrical shape with respect to the main line, the difference in the directivity depending on the direction of the signal to be detected can be reduced more effectively. As a result, the directional coupler 1 with more stable detection accuracy can be obtained.

The specific examples of the connection states of the directional coupler 1, formed by the switch 30, will be described below.

Figure 4:
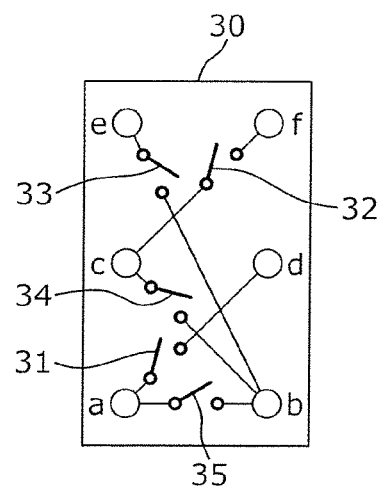
FIG. 4 is an equivalent circuit diagram illustrating an example of a switch configuration according to Embodiment 1.

FIG. 4 is an equivalent circuit diagram illustrating an example of a configuration of the switch 30. As illustrated in FIG. 4, the switch 30 includes five switches 31 to 35, each of which is a single-pole single-throw (SPST) switch disposed between two of the terminals a to f.

The terminals a and b are connected respectively to the one end portion and the other end portion of the sub-line 21, and are arranged at positions facing each other. The terminals c and d are connected respectively to the one end portion and the other end portion of the sub-line 22, and are arranged at positions facing each other. The terminals e and f are connected respectively to the one end portion and the other end portion of the sub-line 23, and are arranged at positions facing each other.

The switch 31 is disposed between the terminals a and d to switch the connection and disconnection between the one end portion of the sub-line 21 and the other end portion of the sub-line 22.

The switch 32 is disposed between the terminals c and f to switch the connection and disconnection between the one end portion of the sub-line 22 and the other end portion of the sub-line 23.

The switch 33 is disposed between the terminals e and b to switch the connection and disconnection between the one end portion of the sub-line 23 and the other end portion of the sub-line 21.

The switch 34 is disposed between the terminals c and b to switch the connection and disconnection between the one end portion of the sub-line 22 and the other end portion of the sub-line 21.

The switch 35 is disposed between the terminals a and b to switch the connection and disconnection between the one end portion and the other end portion of the sub-line 21.

Thus, the switch 30 includes one or more switches each of which switches the connection and disconnection between the terminals arranged at positions facing each other (namely between the end portions of one sub-line), and one or more switches each of which switches the connection and disconnection between the terminals arranged at positions not facing each other (namely between the end portions of the different sub-lines).

Figure 5A:
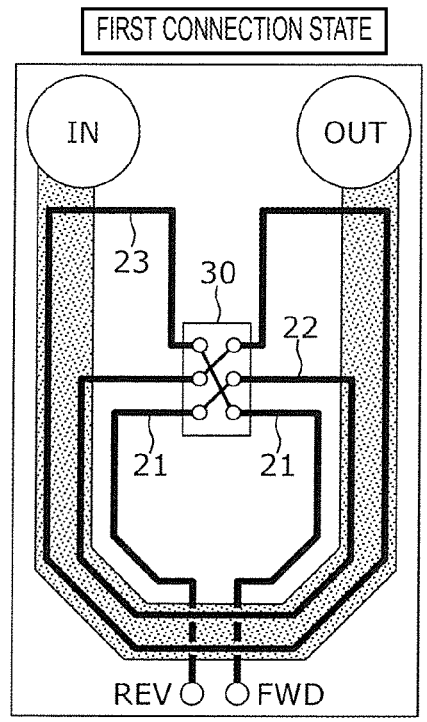
FIG. 5A is a plan view illustrating an example of a connection state of the directional coupler according to Embodiment 1.
Figure 5B:
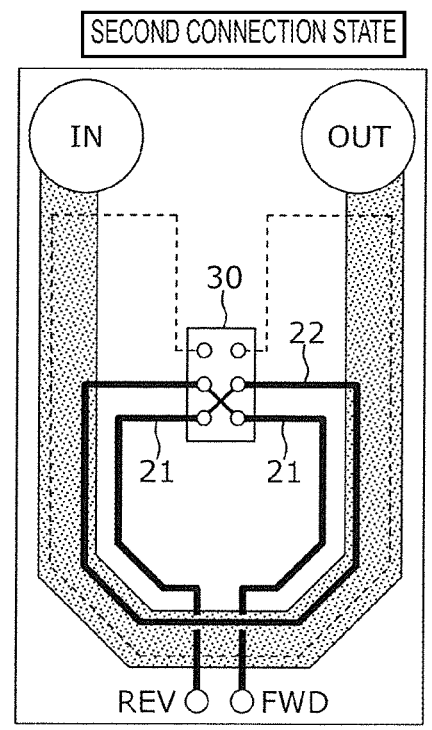
FIG. 5B is a plan view illustrating an example of the connection state of the directional coupler according to Embodiment 1.
Figure 5C:
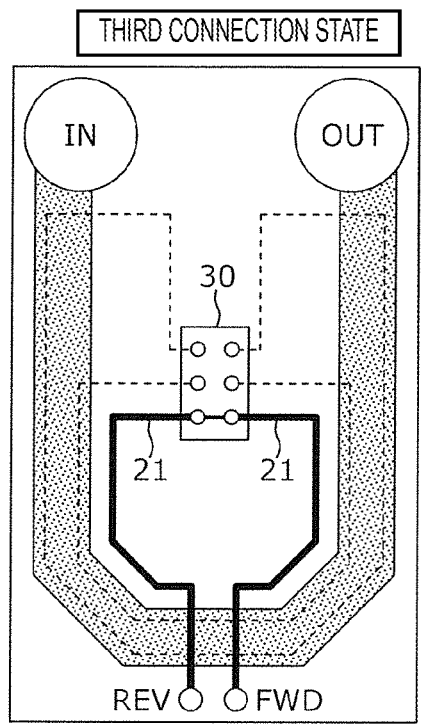
FIG. 5C is a plan view illustrating an example of the connection state of the directional coupler according to Embodiment 1.

FIGS. 5A, 5B and 5C are plan views illustrating respectively examples of a first connection state, a second connection state, and a third connection state that can be taken by the directional coupler 1. In FIGS. 5A, 5B and 5C, for clear representation of the connection states, the whole of one or more of the sub-lines 21, 22 and 23, the one or more sub-lines being continuously connected to form a single sub-line, is denoted by the bold line, including portions hidden by the main line 20, and the other one or more sub-lines are each denoted by the dotted line.

The first connection state illustrated in FIG. 5A represents a state in which the sub-lines 21, 22 and 23 are continuously connected to form a single sub-line, both ends of which are connected to the detected signal output terminals FWD and REV. In the first connection state, a first signal of a first frequency band is detected. The first frequency band may be the so-called low band (LB) of 0.6 GHz to 1.0 GHz, for example.

The second connection state illustrated in FIG. 5B represents a state in which the sub-lines 21 and 22 are continuously connected to form a single sub-line, both ends of which are connected to the detected signal output terminals FWD and REV. In the second connection state, a second signal of a second frequency band higher than the first frequency band is detected. The wording "second frequency band higher than the first frequency band" may imply that a lower limit frequency of the second frequency band is higher than an upper limit frequency of the first frequency band. The second frequency band may be the so-called high band (HB) of 1.5 GHz to 2.5 GHz, for example.

The third connection state illustrated in FIG. 5C represents a state in which only the sub-line 21 is continuously connected to form a single sub-line, both ends of which are connected to the detected signal output terminals FWD and REV. In the third connection state, a third signal of a third frequency band higher than the second frequency band is detected. The wording "third frequency band higher than the second frequency band" may imply that a lower limit frequency of the third frequency band is higher than an upper limit frequency of the second frequency band. The third frequency band may be the so-called ultrahigh band (UHB) of 3.5 GHz to 4.0 GHz, for example.

In the examples of FIGS. 5A, 5B and 5C, the sub-line 21 is an example of a first sub-line through which the first signal, the second signal, and the third signal are transferred. The sub-line 22 is an example of a second sub-line through which the first signal and the second signal are transferred, and the sub-line 23 is an example of a third sub-line through which the first signal is transferred.

Figure 6A:
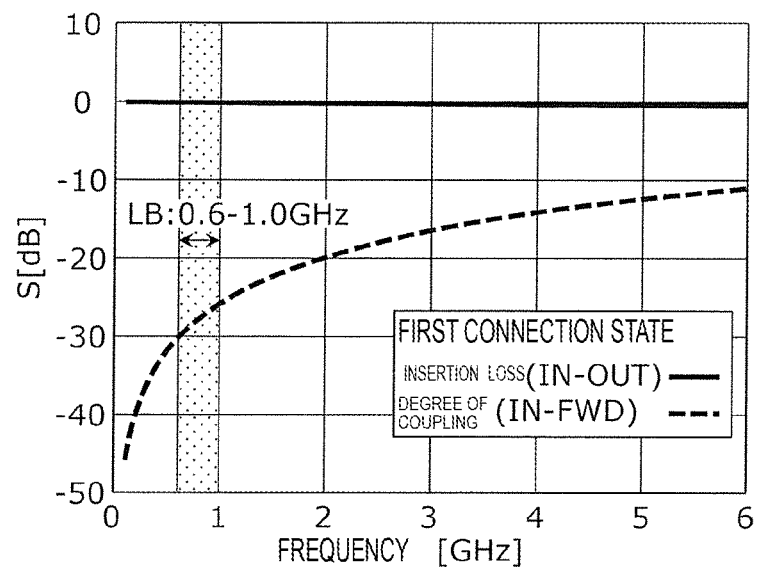
FIG. 6A is a graph depicting an example of frequency characteristics of the directional coupler according to Embodiment 1.
Figure 6B:
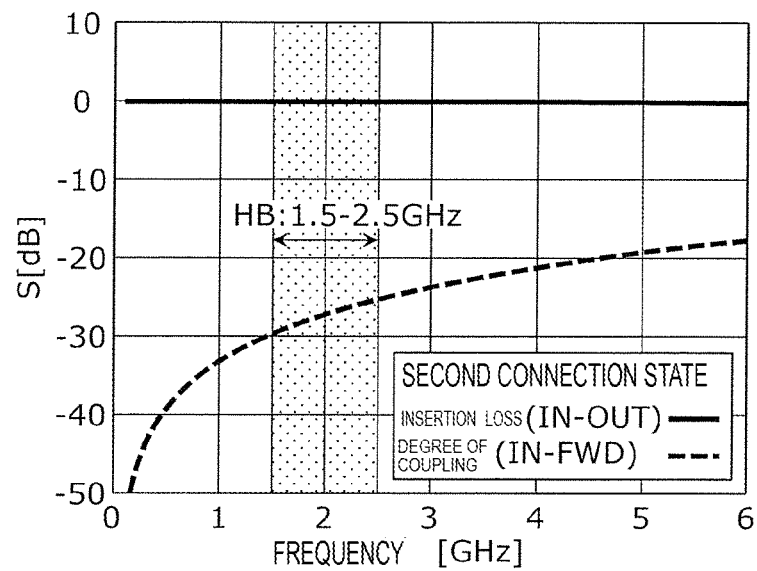
FIG. 6B is a graph depicting an example of the frequency characteristics of the directional coupler according to Embodiment 1.
Figure 6C:
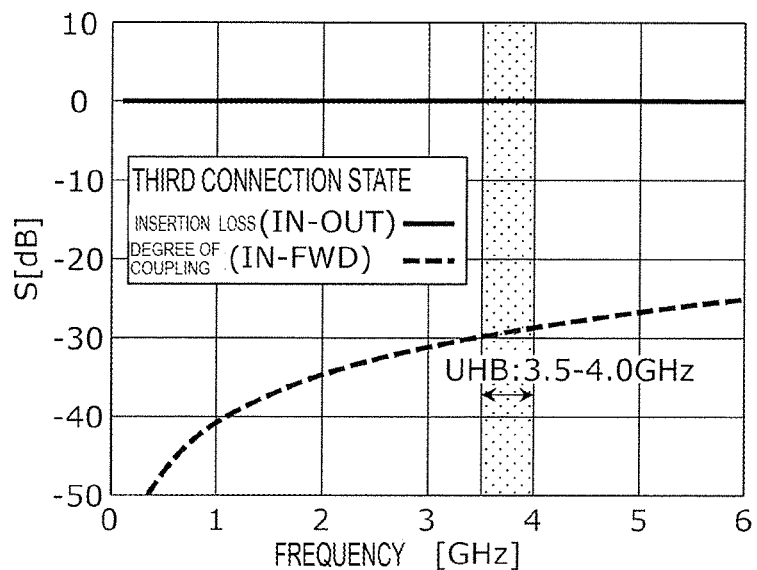
FIG. 6C is a graph depicting an example of the frequency characteristics of the directional coupler according to Embodiment 1.

FIGS. 6A, 6B and 6C are graphs depicting examples of frequency characteristics of the directional coupler 1, respectively, in the first connection state, the second connection state, and the third connection state. The directional coupler 1 is designed to be able to obtain the degree of coupling of −30 dB for each of the LB, HB and UHB signals, respectively, in the first, second and third connection states. The target degree of coupling is achieved at a lower end of each frequency band. Thus, the degrees of coupling for the LB, HB and UHB signals in the first, second and third connection states, illustrated in FIGS. 6A to 6C, are all within a range of about −25 to −30 dB.

On the other hand, for example, if the LB, HB and UHB signals are detected only in the first connection state, it is seen from FIG. 6A that, when the HB and UHB signals are detected, the degree of signal coupling becomes too strong and the insertion loss degrades.

More specifically, when a signal of 3.8 GHz included in the UHB is detected in the first connection state, the degree of coupling is −14.5 dB and the insertion loss is −0.195 dB. In contrast, when a signal of 3.8 GHz included in the UHB is detected in the third connection state, the degree of coupling is −29.0 dB and the insertion loss is −0.006 dB.

As understood from the above, the configuration of switching the connection states of the sub-lines depending on the frequency band of the signal to be detected is effective. In addition, as described above, the difference in the directivity depending on the direction of the signal to be detected is reduced and more stable detection accuracy can be obtained.

Embodiment 2

Embodiment 2 is described in connection with a 4-port directional coupler that includes an input port IN, an output port OUT, and detected signal output terminals FWD and REV, and that can switch degrees of coupling between a main line and sub-lines with a switch, as in Embodiment 1.

The directional coupler according to Embodiment 2 is different in planar structure from the directional coupler 1 described in Embodiment 1, but it has the same function and advantageous effects. The following description is made mainly about different points from Embodiment 1 while the description of matters overlapping with those in Embodiment 1 is omitted.

First, an example of the planar structure of the directional coupler according to Embodiment 2 is described.

Figure 7:
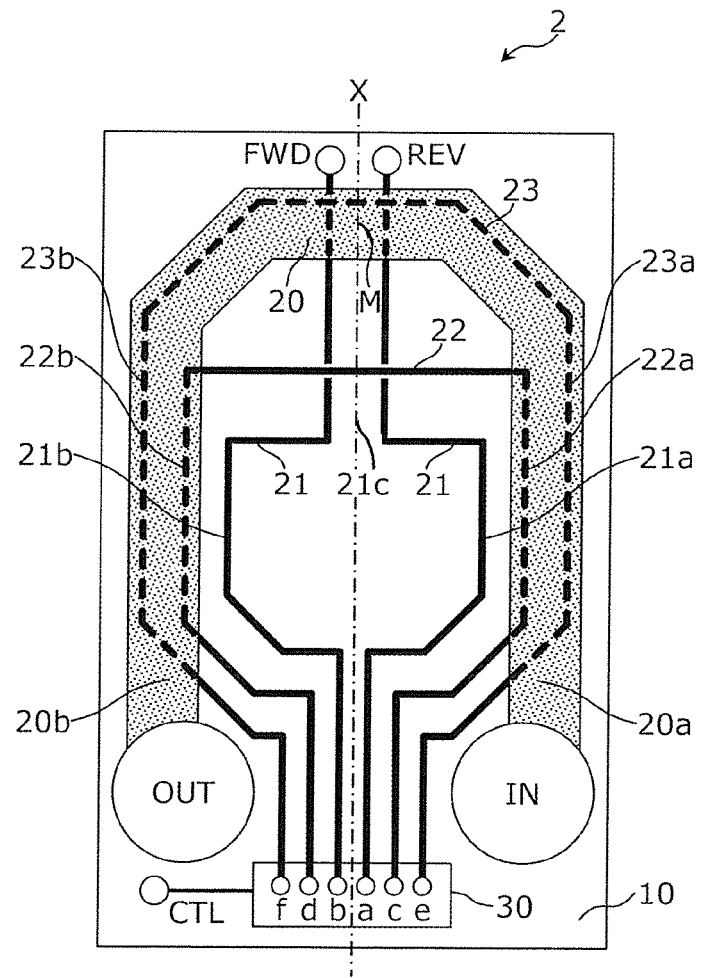
FIG. 7 is a plan view illustrating an example of a planar structure of a directional coupler according to Embodiment 2.

FIG. 7 is a plan view illustrating an example of the planar structure of the directional coupler 2 according to Embodiment 2. As in the directional coupler 1 of FIG. 1, the directional coupler 2 includes the substrate 10, the main line 20, the sub-lines 21, 22 and 23, and the switch 30. In FIG. 7, portions of the sub-lines 21, 22 and 23 hidden by the main line 20 are denoted by the dashed lines as in FIG. 1.

In the directional coupler 2, when looking at the substrate 10 in plan, the main line 20 is formed in an inverted U-like shape in which the midpoint M is positioned in a region along the upper side of the substrate 10 and the first end and the second end are positioned along the lower side of the substrate 10. The sub-line 23 has a shape following the main line 20 (particularly, in a top portion of the inverted U-like shape of the main line 20).

The input port IN and the output port OUT are disposed in regions along the lower side of the substrate 10 and are connected respectively to the first end and the second end of the main line 20.

The switch 30 is disposed in a region along the lower side of the substrate 10. Terminals a to f of the switch 30 are arranged in a line. The terminals a to f of the switch 30 may be arranged in a straight line. End portions of each of the sub-lines 21, 22 and 23 are connected to the switch 30 in a region along the lower side of the substrate 10.

The detected signal output terminals REV and FWD are disposed in a region along the upper side of the substrate 10. The gap 21c of the sub-line 21 is disposed in a central portion of the substrate 10, and one end and the other end of the sub-line 21 sandwiching the gap 21c are connected respectively to the detected signal output terminals REV and FWD by lead-out lines extending from the central portion of the substrate 10 toward the upper side thereof. In other words, one of both end portions of the first coupling portion 21a, the one end portion being not connected to the switch 30, is connected to the detected signal output terminal REV, and one of both end portions of the second coupling portion 21b, the one end portion being not connected to the switch 30, is connected to the detected signal output terminal FWD.

A sectional structure of the directional coupler 2 is the same as that of the directional coupler 1 illustrated in FIG. 2, and hence the description of the sectional structure is omitted.

Also, with the directional coupler 2, as with the directional coupler 1, since it is easier to form each of the sub-lines 21, 22 and 23 symmetrically with respect to the main line 20, the difference in the directivity depending on the direction of the signal to be detected is reduced. As a result, the directional coupler with stable detection accuracy can be obtained.

Specific examples of the connection states of the directional coupler 2, formed by the switch 30, will be described below.

Figure 8:
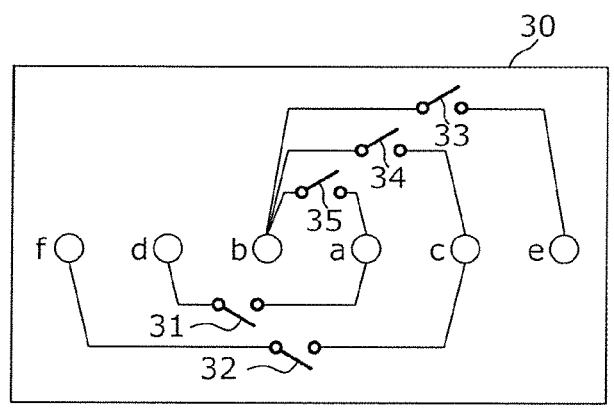
FIG. 8 is an equivalent circuit diagram illustrating an example of a switch configuration according to Embodiment 2.

FIG. 8 is an equivalent circuit diagram illustrating an example of a configuration of the switch 30. As illustrated in FIG. 8, the switch 30 includes five switches 31 to 35 that are each a single-pole single-throw (SPST) switch disposed between two of the terminals a to f.

The terminals a and b are connected respectively to the one end portion and the other end portion of the sub-line 21, and are arranged at symmetrical positions in the terminals a to f that are arranged in a line. The terminals c and d are connected respectively to the one end portion and the other end portion of the sub-line 22, and are arranged at symmetrical positions in the terminals a to f that are arranged in a line. The terminals e and f are connected respectively to the one end portion and the other end portion of the sub-line 23, and are arranged at symmetrical positions in the terminals a to f that are arranged in a line. Here, the wording "symmetrical positions in the terminals a to f that are arranged in a line" may imply positions away from a center of the line of the arranged terminals on both the sides by the same number of terminal(s).

The switch 31 is disposed between the terminals a and d to switch the connection and disconnection between the one end portion of the sub-line 21 and the other end portion of the sub-line 22.

The switch 32 is disposed between the terminals c and f to switch the connection and disconnection between the one end portion of the sub-line 22 and the other end portion of the sub-line 23.

The switch 33 is disposed between the terminals e and b to switch the connection and disconnection between the one end portion of the sub-line 23 and the other end portion of the sub-line 21.

The switch 34 is disposed between the terminals c and b to switch the connection and disconnection between the one end portion of the sub-line 22 and the other end portion of the sub-line 21.

The switch 35 is disposed between the terminals a and b to switch the connection and disconnection between the one end portion and the other end portion of the sub-line 21.

Thus, the switch 30 has a plurality of terminals arranged in a line and includes one or more switches each of which switches the connection and disconnection between those ones of the terminals arranged at symmetrical positions (namely between the end portions of one sub-line), and one or more switches each of which switches the connection and disconnection between those ones of the terminals arranged at asymmetrical positions (namely between the end portions of the different sub-lines).

Figure 9A:
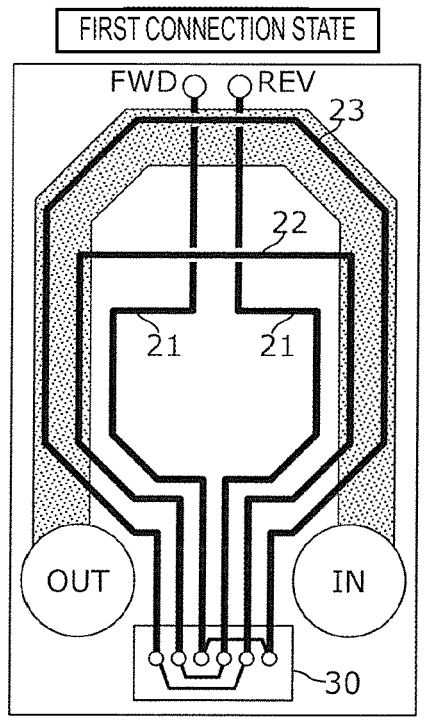
FIG. 9A is a plan view illustrating an example of a connection state of the directional coupler according to Embodiment 2.
Figure 9B:
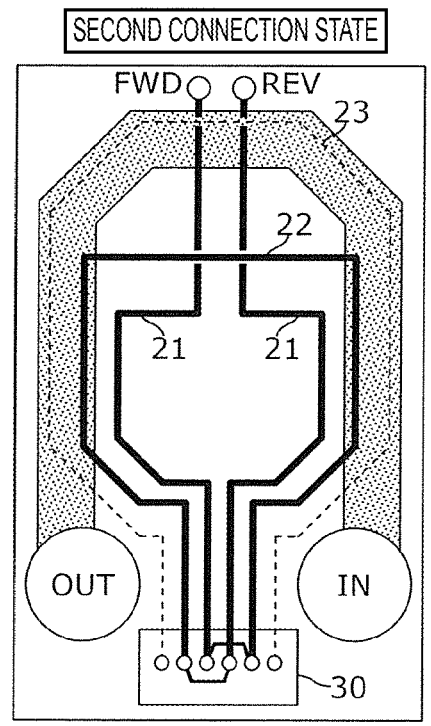
FIG. 9B is a plan view illustrating an example of the connection state of the directional coupler according to Embodiment 2.
Figure 9C:
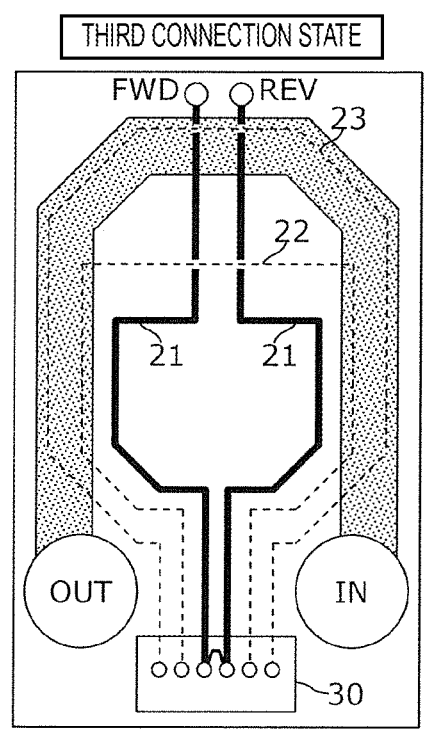
FIG. 9C is a plan view illustrating an example of the connection state of the directional coupler according to Embodiment 2.

FIGS. 9A, 9B and 9C are plan views illustrating respectively examples of a first connection state, a second connection state, and a third connection state that can be taken by the directional coupler 2. In FIGS. 9A, 9B and 9C, for clear representation of the connection states, the whole of one or more of the sub-lines 21, 22 and 23, the one or more sub-lines being continuously connected to form a single sub-line, is denoted by the bold line, including portions hidden by the main line 20, and the other one or more sub-lines are each denoted by the dotted line.

The first connection state illustrated in FIG. 9A represents a state in which the sub-lines 21, 22 and 23 are continuously connected to form a single sub-line both ends of which are connected to the detected signal output terminals FWD and REV. The second connection state illustrated in FIG. 9B represents a state in which the sub-lines 21 and 22 are continuously connected to form a single sub-line both ends of which are connected to the detected signal output terminals FWD and REV. The third connection state illustrated in FIG. 9C represents a state in which only the sub-line 21 is continuously connected to form a single sub-line both ends of which are connected to the detected signal output terminals FWD and REV.

A first signal of a first frequency band, a second signal of a second frequency band higher than the first frequency band, and a third signal of a third frequency band higher than the second frequency band may be detected respectively in the first connection state, the second connection state, and the third connection state of FIGS. 9A, 9B and 9C.

The first frequency band, the second frequency band, and the third frequency band may be respectively the low band, the high band, and the ultrahigh band described in Embodiment 1.

In the examples of FIGS. 9A, 9B and 9C, the sub-lines 21, 22 and 23 are examples of the first sub-line, the second sub-line, and the third sub-line, respectively, as in the examples of FIGS. 5A, 5B and 5C.

Since the connection states of FIGS. 9A, 9B and 9C have substantially the same electrical characteristics as those in the connection states of FIGS. 5A, 5B and 5C described in Embodiment 1, respectively, the directional coupler 2 can also obtain the degrees of coupling in the individual frequency bands, which fall within similar ranges. In addition, as described above, the difference in the directivity depending on the direction of the signal to be detected is reduced and more stable detection accuracy can be obtained.

The directional couplers according to the embodiments of the present disclosure have been described above, but the present disclosure is not limited to the above-described specific embodiments. Other embodiments resulted from not only variously altering the specific embodiments by those skilled in the art, but also combining constituent elements used in the different embodiments may also fall within the scope of one or more forms of the present disclosure insofar as the other embodiments do not depart from the gist of the present disclosure.

While, in the embodiments, one end and the other end of the sub-line 21 sandwiching the gap 21c are connected respectively to the detected signal output terminals FWD and REV, the present disclosure is not limited to such a case. The detected signal output terminals FWD and REV just need to be connected to the sub-line that is used for detecting the signals of all the frequency bands. For example, when the sub-line 22 is used for detecting the signals of all the frequency bands depending on the connection states of the switch 30, a gap may be formed in a central portion of the sub-line 22, and one end and the other end of the sub-line 22 sandwiching the gap may be connected respectively to the detected signal output terminals FWD and REV.

(Recapitulation)

As described above, a directional coupler according to the embodiment of the present disclosure includes a substrate, a main line formed directly or indirectly on the substrate, a plurality of sub-lines at least part of each of which is formed directly or indirectly on the substrate along the main line, a switch switching connections among end portions of the plurality of sub-lines, and detection output terminals connected to one of the plurality of sub-lines, wherein, when looking at the substrate in plan, the end portions of the plurality of sub-lines are disposed on the opposite side to the detection output terminals relative to the main line, and the sub-line to which the detection output terminals are connected is overlapped with or surrounded by the other one or more sub-lines.

With the above-described feature, since it is easier to form each of the sub-lines symmetrically with respect to the main line, the difference in the directivity depending on the direction of a signal to be detected is reduced. As a result, the directional coupler with stable detection accuracy can be obtained.

The directional coupler may further include a plurality of layers laminated directly or indirectly on the substrate, and at least two of the plurality of sub-lines may be formed in different ones of the plurality of layers in a one-to-one relation.

With the above-described feature, since the degree of coupling between each of the sub-lines and the main line can be more flexibly adjusted over a wider range than in the case in which the plurality of sub-lines are formed in the same plane. Therefore, more uniform directivity is easier to obtain between the case of handling the signal of the high frequency band and the case of handling the signal of the low frequency band.

The at least two of the plurality of sub-lines may have different lengths from each other, and longer one of the at least two sub-lines may be formed in one of the plurality of layers, the one layer being located at an upper position than a layer in which shorter one of the at least two sub-lines is formed.

With the above-described feature, since the degree of coupling between each of the sub-lines and the main line can be more flexibly adjusted over a wider range than in the case in which the plurality of sub-lines have the same length, more uniform directivity is easier to obtain between the case of handling the signal of the high frequency band and the case of handling the signal of the low frequency band.

The directional coupler may further include a pair of input/output terminals connected to the main line, and when looking at the substrate in plan, all of the plurality of sub-lines may not need to be overlapped with the input/output terminals.

With the above-described feature, since the sub-lines are disposed without interfering with the input/output terminals at which an electromagnetic field tends to concentrate, more uniform directivity is easier to obtain.

Film thicknesses of wirings forming the plurality of sub-lines may be each smaller than a film thickness of a wiring forming the main line.

With the above-described feature, since the sub-lines tending to be longer than the main line are each formed by the wiring with the smaller film thickness, the size of the directional coupler can be reduced.

A width of a wiring forming the main line may be greater than a width of each of wirings forming the plurality of sub-lines.

With the above-described feature, since the main line through which a larger current than through the sub-lines passes is formed by the wiring with the greater width, the insertion loss of the directional coupler can be reduced.

The plurality of sub-lines may include a first sub-line through which a first signal of a first frequency band, a second signal of a second frequency band higher than the first frequency band, and a third signal of a third frequency band higher than the second frequency band are transferred, a second sub-line through which the first signal and the second signal are transferred, and a third sub-line through which the first signal is transferred, and the directional coupler may take a plurality of connection states including at least a first connection state in which the first sub-line, the second sub-line, and the third sub-line are continuously connected by the switch to form a single sub-line, a second connection state in which the first sub-line and the second sub-line are continuously connected by the switch to form a single sub-line, and a third connection state in which only the first sub-line is continuously connected by the switch to form a single sub-line.

With the above-described feature, the directional coupler can be obtained in which the insertion loss is small for each of three types of signals of different frequency bands and the directivity in signal detection is made more uniform.

The present disclosure can be utilized as a directional coupler in various fields.

1, 2, 9 directional coupler
10 substrate
11 first metal film
12 second metal film
13 third metal film
14 fourth metal film
15 fifth metal film
16 interlayer conductor
17 insulating film
18 connection electrode
20 main line
20a first portion
20b second portion
21, 22, 23 sub-line
21a, 22a, 23a first coupling portion
21b, 22b, 23b second coupling portion
21c gap
30 to 35 switch

What is claimed is:

1. A directional coupler comprising:
a substrate;
a main line provided directly or indirectly on the substrate;
a plurality of sub-lines, at least a part of each of the plurality of sub-lines being provided directly or indirectly on the substrate along the main line;
a switch switching connections among end portions of the plurality of sub-lines; and
detection output terminals connected to one of the plurality of sub-lines,
wherein, when looking at the substrate in plan, the end portions of the plurality of sub-lines are disposed on an opposite side to the detection output terminals relative to the main line, and the one of the plurality of sub-lines to which the detection output terminals are connected is overlapped with or surrounded by other one or more of the plurality of sub-lines,
wherein the end portions of each of the plurality of sub-lines are positioned in an inner side of the main line so as to define a ring-like shape, and
wherein, when looking at the substrate in plan, each sub-line has a first end portion and a second end portion, both of which define the ring-like shape and are positioned relative to the inner side of the main line.

2. The directional coupler according to claim 1, further comprising a plurality of layers laminated directly or indirectly on the substrate,
wherein at least two of the plurality of sub-lines are respectively provided in different ones of the plurality of layers.

3. The directional coupler according to claim 2, wherein the at least two of the plurality of sub-lines have different lengths from each other, and
longer one of the at least two sub-lines is provided in one of the plurality of layers located at an upper position than a layer in which shorter one of the at least two sub-lines is provided.

4. The directional coupler according to claim 1, further comprising a pair of input/output terminals connected to the main line,
wherein, when looking at the substrate in plan, none of the plurality of sub-lines is overlapped with the input/output terminals.

5. The directional coupler according to claim 1, wherein film thicknesses of wirings in the plurality of sub-lines are each smaller than a film thickness of a wiring in the main line.

6. The directional coupler according to claim 1, wherein a width of a wiring in the main line is greater than a width of each of wirings in the plurality of sub-lines.

7. The directional coupler according to claim 1, wherein the plurality of sub-lines include a first sub-line, a second sub-line and a third sub-line, wherein a first signal of a first frequency band, a second signal of a second frequency band higher than the first frequency band, and a third signal of a third frequency band higher than the second frequency band are transferred through the first sub-line, the first signal and the second signal are transferred through the second sub-line, and the first signal is transferred through the third sub-line, and
the directional coupler takes a plurality of connection states including at least a first connection state, a second connection state and a third connection state, wherein the first sub-line, the second sub-line, and the third sub-line are continuously connected by the switch to form a single sub-line in the first connection state, the first sub-line and the second sub-line are continuously connected by the switch to form a single sub-line in the second connection state, and only the first sub-line is continuously connected by the switch to form a single sub-line in the third connection state.

8. The directional coupler according to claim 2, further comprising a pair of input/output terminals connected to the main line,
wherein, when looking at the substrate in plan, none of the plurality of sub-lines is overlapped with the input/output terminals.

9. The directional coupler according to claim 3, further comprising a pair of input/output terminals connected to the main line, wherein, when looking at the substrate in plan, none of the plurality of sub-lines is overlapped with the input/output terminals.

10. The directional coupler according to claim 2, wherein film thicknesses of wirings in the plurality of sub-lines are each smaller than a film thickness of a wiring in the main line.

11. The directional coupler according to claim 3, wherein film thicknesses of wirings in the plurality of sub-lines are each smaller than a film thickness of a wiring in the main line.

12. The directional coupler according to claim 4, wherein film thicknesses of wirings in the plurality of sub-lines are each smaller than a film thickness of a wiring in the main line.

13. The directional coupler according to claim 2, wherein a width of a wiring in the main line is greater than a width of each of wirings in the plurality of sub-lines.

14. The directional coupler according to claim 3, wherein a width of a wiring in the main line is greater than a width of each of wirings in the plurality of sub-lines.

15. The directional coupler according to claim 4, wherein a width of a wiring in the main line is greater than a width of each of wirings in the plurality of sub-lines.

16. The directional coupler according to claim 5, wherein a width of a wiring in the main line is greater than a width of each of wirings in the plurality of sub-lines.

17. The directional coupler according to claim 2, wherein the plurality of sub-lines include a first sub-line, a second sub-line and a third sub-line, wherein a first signal of a first frequency band, a second signal of a second frequency band higher than the first frequency band, and a third signal of a third frequency band higher than the second frequency band are transferred through the first sub-line, the first signal and the second signal are transferred through the second sub-line, and the first signal is transferred through the third sub-line, and the directional coupler takes a plurality of connection states including at least a first connection state, a second connection state and a third connection state, wherein the first sub-line, the second sub-line, and the third sub-line are continuously connected by the switch to form a single sub-line in the first connection state, the first sub-line and the second sub-line are continuously connected by the switch to form a single sub-line in the second connection state, and only the first sub-line is continuously connected by the switch to form a single sub-line in the third connection state.

18. The directional coupler according to claim 3, wherein the plurality of sub-lines include a first sub-line, a second sub-line and a third sub-line, wherein a first signal of a first frequency band, a second signal of a second frequency band higher than the first frequency band, and a third signal of a third frequency band higher than the second frequency band are transferred through the first sub-line, the first signal and the second signal are transferred through the second sub-line, and the first signal is transferred through the third sub-line, and the directional coupler takes a plurality of connection states including at least a first connection state, a second connection state and a third connection state, wherein the first sub-line, the second sub-line, and the third sub-line are continuously connected by the switch to form a single sub-line in the first connection state, the first sub-line and the second sub-line are continuously connected by the switch to form a single sub-line in the second connection state, and only the first sub-line is continuously connected by the switch to form a single sub-line in the third connection state.

19. The directional coupler according to claim 4, wherein the plurality of sub-lines include a first sub-line, a second sub-line and a third sub-line, wherein a first signal of a first frequency band, a second signal of a second frequency band higher than the first frequency band, and a third signal of a third frequency band higher than the second frequency band are transferred through the first sub-line, the first signal and the second signal are transferred through the second sub-line, and the first signal is transferred through the third sub-line, and the directional coupler takes a plurality of connection states including at least a first connection state, a second connection state and a third connection state, wherein the first sub-line, the second sub-line, and the third sub-line are continuously connected by the switch to form a single sub-line in the first connection state, the first sub-line and the second sub-line are continuously connected by the switch to form a single sub-line in the second connection state, and only the first sub-line is continuously connected by the switch to form a single sub-line in the third connection state.

20. The directional coupler according to claim 5, wherein the plurality of sub-lines include a first sub-line, a second sub-line and a third sub-line, wherein a first signal of a first frequency band, a second signal of a second frequency band higher than the first frequency band, and a third signal of a third frequency band higher than the second frequency band are transferred through the first sub-line, the first signal and the second signal are transferred through the second sub-line, and the first signal is transferred through the third sub-line, and the directional coupler takes a plurality of connection states including at least a first connection state, a second connection state and a third connection state, wherein the first sub-line, the second sub-line, and the third sub-line are continuously connected by the switch to form a single sub-line in the first connection state, the first sub-line and the second sub-line are continuously connected by the switch to form a single sub-line in the second connection state, and only the first sub-line is continuously connected by the switch to form a single sub-line in the third connection state.

* * * * *